United States Patent [19]
Kato et al.

[11] Patent Number: 5,293,069
[45] Date of Patent: Mar. 8, 1994

[54] CERAMIC-GLASS IC PACKAGE ASSEMBLY HAVING MULTIPLE CONDUCTIVE LAYERS

[75] Inventors: Naomiki Kato; Kazuyuki Maruyama, both of Aichi, Japan

[73] Assignee: NGK Spark Plug Co., Ltd., Nagoya, Japan

[21] Appl. No.: 974,894

[22] Filed: Nov. 12, 1992

[30] Foreign Application Priority Data

Nov. 15, 1991 [JP] Japan ................... 3-300433
Sep. 1, 1992 [JP] Japan ................... 4-258962

[51] Int. Cl.[5] ................... H01L 23/02; H01L 23/12; H01L 39/02; H01L 23/29
[52] U.S. Cl. ................... 257/698; 257/691
[58] Field of Search ................... 257/691, 698, 700

[56] References Cited

U.S. PATENT DOCUMENTS

| | | | |
|---|---|---|---|
| 4,608,592 | 8/1986 | Miyamoto | 257/691 |
| 4,814,943 | 3/1989 | Okuaki | 257/787 |
| 4,827,327 | 5/1989 | Miyauchi et al. | 257/700 |
| 4,890,155 | 12/1989 | Miyagawa et al. | 257/700 |
| 4,922,324 | 5/1990 | Sudo | 757/700 |
| 4,949,163 | 8/1990 | Sudo et al. | 757/784 |
| 4,992,628 | 2/1991 | Beppu et al. | 257/780 |
| 5,095,359 | 3/1992 | Tanaka et al. | 257/691 |
| 5,134,246 | 7/1992 | Beppu et al. | |

FOREIGN PATENT DOCUMENTS

| | | |
|---|---|---|
| 62-4857 | 2/1987 | Japan . |
| 62-59892 | 12/1987 | Japan . |
| 2-21654 | 5/1990 | Japan . |
| 3-40950 | 6/1991 | Japan . |

*Primary Examiner*—Sheila V. Clark
*Attorney, Agent, or Firm*—Foley & Lardner

[57] ABSTRACT

A ceramic base of an IC package has a laminated structure and has two conductive layers sandwiched between insulating ceramic layers. One of the conductive layers is used as a power source layer and electrically connects a plurality of power source terminals of an IC chip to a single power source lead. The other conductive layer is used as an earth layer and electrically connects a plurality of earth terminals of the IC chip to a single earth lead.

20 Claims, 5 Drawing Sheets

CERAMIC-GLASS IC PACKAGE ASSEMBLY HAVING MULTIPLE CONDUCTIVE LAYERS

BACKGROUND OF THE INVENTION

1. Field of the invention

The present invention relates in general to packaging of an IC (integrated circuit) chip and more particularly to an IC package of the kind in which external leads are connected to the surface of a ceramic base by means of sealing glass such as low temperature glass.

2. Description of the Prior Art

In an IC package of the kind in which external leads are fixed by using sealing glass such as low temperature glass, a single layer ceramic base is used. The ceramic base is formed by pressing and thereafter sintered. The ceramic base is applied with glass powder paste on which the external leads are placed. The glass powder paste is then heated and baked to the ceramic base so that the external leads are secured to the ceramic base.

After an IC chip is placed on the center of the ceramic base and the external leads are connected to the base by wire bonding, a ceramic cap applied with glass powder paste is joined with the ceramic base in such a manner as to hold the external leads therebetween. The glass powder paste applied on the cap side is then heated to melt so that the external leads are glass-sealed between the base and the cap. In the above manner, a low-cost IC package can be obtained.

In such a prior art IC package, the external leads are formed from Koval, alloy 42 or the like material having such a thermal expansion coefficient proximate to that of a general ceramic material consisting of alumina. Further, a material for sealing glass which is applied at least on the cap side is low temperature glass containing Pb(lead) so that the IC chip is not heated up to an abnormally high temperature at the time of glass-sealing.

However, since Koval or alloy used for forming the external leads contains Fe, Ni, etc. as major constituents, the inductance L of the external lead is 15 times higher than that of the Cu-type lead (non-magnetic body). On the other hand, in the case where electric current flows through the power source lead and earth lead, a counter electromotive force $E = -L / di / dt$ is generated. Accordingly, when the external leads are formed from a material of high inductance, the variation of electric potential at the power source lead and earth lead at the time of high-speed operation becomes large, thus making it difficult to attain high-speed operation of the integrated circuit.

Further, in the case where all of the external leads are connected to the integrated circuit directly by means of bonding wires, it is necessitated that the power source leads and earth leads correspond in number to the power source terminals and earth terminals of the integrated circuit, resulting in the necessity of a number of external leads and therefore a large-sized IC package.

Further, the leaded glass is higher in dielectric constant than ceramic such as alumina ceramic. Accordingly, the longer portion of the external lead is enclosed by the sealing glass, the slower it becomes the signal propagation through the external lead, thus being disadvantageous for high-speed operation.

SUMMARY OF THE INVENTION

In accordance with an aspect of the present invention, there is provided an IC package which comprises an insulating ceramic base having a conductive layer therewithin, an IC chip installed on the ceramic base and electrically connected to the conductive layer, an external lead electrically connected to the IC chip, and sealing glass means for securing the external lead to the ceramic base.

In accordance with another aspect of the present invention, there is provided an IC package assembly which comprises a ceramic base having a laminated structure including first and second conductive layers, an IC chip installed on the base and having a plurality of power source terminals electrically connected to the first conductive layer and a plurality of earth terminals connected to the second conductive layer, a first external lead electrically connected to the first conductive layer to serve as a power source lead, a second external lead electrically connected to the second conductive layer to serve as an earth lead, and sealing glass means for securing the first and second external leads to the base.

The IC package of the above structure is effective for solving the above noted problems inherent in the prior art package.

It is accordingly an object of the present invention to provide a novel and improved IC package which can hold down the inductance of the associated power source system and earth system.

It is a further object of the present invention to provide a novel and improved IC package of the above described character which can do without a number of power source leads but one.

It is a further object of the present invention to provide a novel and improved IC package of r-he above described character which can do without a number of earth leads but one.

It is a further object of the present invention to provide a novel and improved IC package of the above described character which is small-sized as compared with a comparable prior art package.

It is a further object of the present invention to provide a novel and improved IC package of the above described character which is considerably cheaper as compared with a comparable prior art IC package of the PGA or LDCC type.

DETAILED DESCRIPTION OF THE PREFERRED EMBODIMENTS

Figure 1:
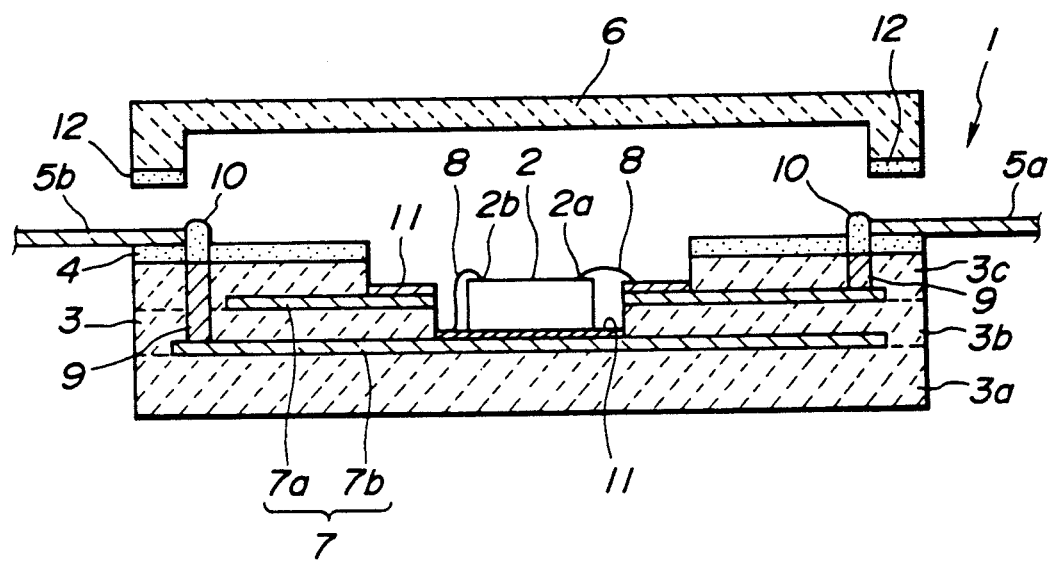
FIG. 1 is a sectional view of an IC package according to an embodiment of the present invention.
Figure 2:
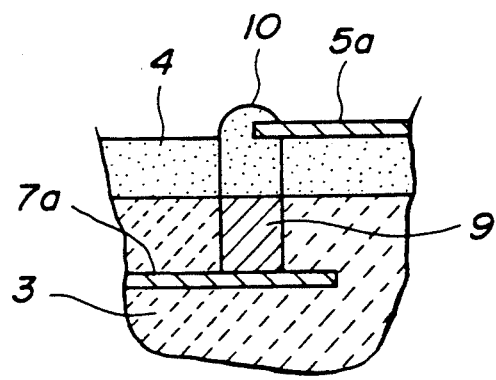
FIG. 2 is an enlarged sectional view of a joining portion between a power source lead and a conductive layer of the package of FIG. 1.

Referring first to FIGS. 1 and 2, an IC package 1 according to an embodiment of the present invention includes a ceramic base 3 having at the central portion thereof a recess in which an IC (integrated circuit) chip 2 is installed, and a plurality of external leads 5 connected to the ceramic base 3 by means of first low temperature glass 4 serving as sealing glass. After installation of the IC chip 2 a closure plate 6 is secured to the base 3 for thereby sealing the IC chip 2. The external leads 5, though not so shown, are arranged radially about the IC chip 2 and include a plurality of signal leads (omitted for brevity), a power source lead 5a and an earth lead 5b. The signal leads have inner ends adjacent the recessed central portion of the base 3. The power source lead 5a and earth lead 5b are shorter than the signal leads and have inner ends located at the outer peripheral portion of the base 3. The external leads 5 are connected to a lead frame at the outer ends thereof.

The ceramic base 3 has a laminated structure consisting of three ceramic layers and two conductive layers 7 interposed between the ceramic layers. One of the conductive layers 7, i.e., the upper one in the drawing, is a power source layer 7a connected through a power source lead 5a to a power source (not shown) and through bonding wires 8 to power source terminals 2a of the IC chip 2 though only one set of bonding wire and power source terminal is shown. The other of the conductive layers 7, i.e., the lower one in the drawing, is an earth layer 7b connected through an earth lead 5b to the earth and through bonding wires 8 to earth terminals 2b of the IC chip 2 though only one set of bonding wire and earth terminal is shown.

The ceramic base 3 is provided with conductive posts 9 at locations adjacent to the respective inner ends of the power source lead 5a and the earth lead 5b, i.e., at outer peripheral portions thereof for electrically connecting the conductive layers 7 to the power source lead 5a and the earth lead 5b, respectively. The conductive posts 9 are formed from conductive ink poured into the corresponding holes of the ceramic base 3. In the meantime, after all of the external leads 5 are secured to the ceramic base 3 by means of the first low temperature glass 4, the conductive posts 9 are electrically connected to the power source lead 5a and the earth lead 5b by means of conductive glass 10 consisting of mixed glass and silver.

Of the external leads 5, the signal leads are connected directly by means of bonding wires 8 to the respective terminals of the IC chip 2, whilst the power source lead 5a and the earth lead 5b are connected through the silver glass 10, conductive posts 9, conductive layers 7 and the bonding wires 8 to the corresponding terminals of the IC chip 2. The external leads 5 are made of alloy 42, koval, or the like and formed by pressing or etching. In the Meantime, the external leads 5 are covered at portions for connection with the bonding wires 8 and the silver glass 10 by layers 11 of Au, Ag or Aluminum by means of evaporation, plating, etc. After the external leads 5 are secured to the ceramic base 3 by means of the first low temperature glass 4, the peripheral lead frame (not shown) is cut off.

The first low temperature glass 4 serves as sealing glass for securing the external leads 5 to the ceramic base 3 and is formed with openings at locations coinciding with the exposed upper ends of the conductive posts 9 so that by the silver glass 10 filling the openings the conductive posts 9 are electrically connected to the power source lead 5a and the earth lead 5b, respectively (refer to FIG. 2).

The above described IC package is produced as follows. The ceramic base 3 is formed from three green sheets 3a, 3b, 3c of alumina which are laminated and sintered. The first green sheet 3a is in the form of a comparatively thicker plate, the second green sheet 3b is in the form of a plate having at the central portion thereof an opening which is sized a little larger than the outer periphery of the IC chip 2, and the third green sheet 3c is in the form of a plate having at the central portion thereof an opening which is larger than the opening of the second green sheet. The nearly entire upper surfaces of the first and second green sheets 3a, 3b are covered by the conductive layers 7 by screen printing. The second and third green sheets 3b, 3c are pierced to have through holes for allowing the conductive posts 9 to be formed therein. The three green sheers 3a, 3b, 3c prepared as above are placed one upon another and, after conductive ink is poured into the through holes, sintered. After sintering, the exposed upper ends of the conductive posts 9 are covered by Ni or Au plating, whereby the ceramic base 3 is completed.

The upper surface of the ceramic base 3 is then applied with the first low temperature glass 4 by printing. In this instance, the printing is made in such a manner that the exposed upper ends of the conductive posts 9 are not covered by the first low temperature glass 4.

The external leads 5 are disposed on the upper surface of the first low temperature glass 4. The first low temperature glass 4 is once heated up to a melting point so that the external leads 5 are secured to the ceramic base 3. Then, the silver glass 10 is poured into the openings around the conductive posts 9 and heated at the temperature of 400° C.~430° C. for about 10 minutes for thereby connecting the conductive posts 9 to the power source lead 5a and the earth lead 5b, respectively.

The closure plate 6 is made of ceramic having the same thermal expansion efficiency with the ceramic base 3 and is secured to the ceramic base 3 by means of the second low temperature glass 12 which has a lower melting point than the first low temperature glass 4 so that the IC chip 2 installed therewithin is hermetically sealed. In the meantime, the closure plate 6 in this embodiment is formed by pressing and then sintered. Further, the first low temperature glass 4 and the second low temperature glass 12 can be of the same quality.

By the above processes, the IC package I is completed.

The IC package I of this embodiment can produce the following effects.

(a) By using the two conductive layers 7 disposed within the ceramic base 3 as the power source layer and the earth layer, respectively, it becomes possible to hold down the inductance of the power source system and the earth system for thereby holding down the variation of the electrical potential caused by the operation of the IC chip 2. As a result, the IC package I can be used for installation of an IC chip 2 of the high-speed operation type.

(b) Although the IC chip 2 has a number of electrical terminals, connection of the power source terminals to the power source layer (i.e., conductive layer 7a connected to the power source) makes it possible to do without a number of power source leads but one 5a. Similarly, though the IC chip 2 has a number of earth terminals, connection of the earth terminals to the earth layer (i.e., conductive layer 7b connected to the earth) makes it possible to do without a number of earth leads but one 5b.

As a result, it becomes possible to reduce the number of the power source lead 5a and the earth lead 5b as compared with that in a comparable prior art device, thus making it possible to obtain a smaller-sized IC package 1.

(c) Since the external leads 5 are secured to the ceramic base 3 by means of the first low temperature glass 4, it becomes possible to reduce the manufacturing cost to half as compared with a comparable prior art, IC package of the type utilizing a laminated base such as the PGA (pin-grid-array) type or LDCC (leaded ceramic chip carrier) type.

(d) It becomes possible to add the function of a condenser at a location between the power source layer and the earth layer.

(e) It becomes possible to reduce the thermal resistance as compared with a comparable prior arc plastic package utilizing a plastic base. The thermal resistance can be reduced further by the provision of thermal veer or thermal spreader.

(f) It is superior in hermetic seal to a comparable prior art package of the plastic molding type.

Figure 3:
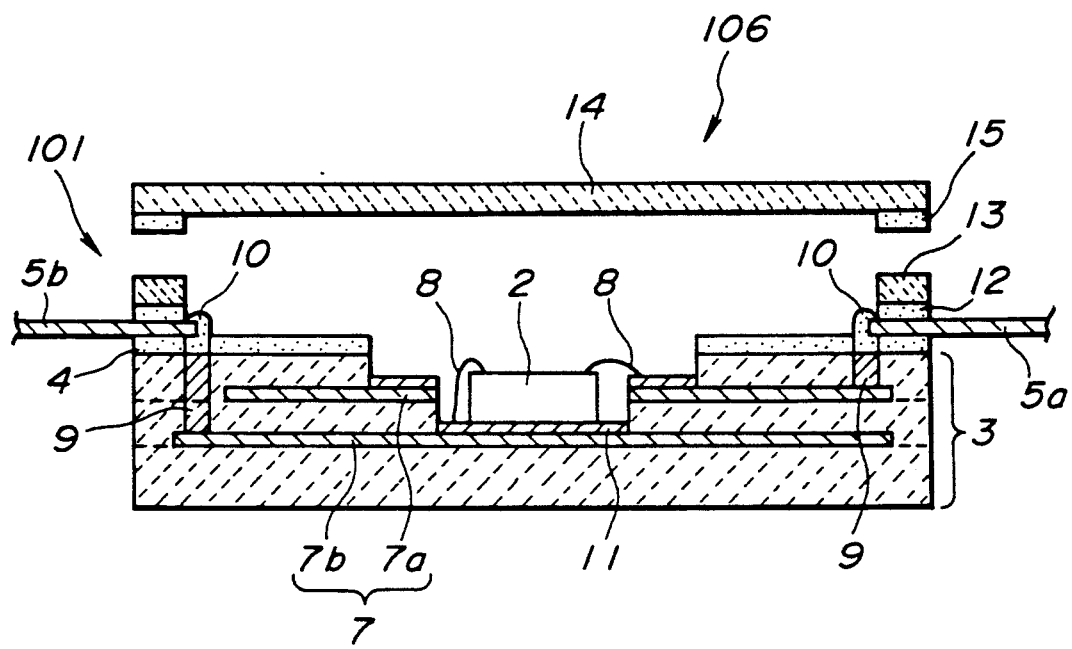
FIG. 3 is a view similar to FIG. 1 but shows another embodiment.

FIG. 3 shows an IC package 101 according to another embodiment of the present invention. This embodiment differs from the previous embodiment of FIGS. 1 and 2 in that the closure plate 106 is formed from a frame 13 and a cover 14. The frame 13 is first secured to the base 3 by means of the second low temperature glass 12, and then the cover 14 is secured to the frame 13 by means of the third low temperature glass which is of a lower melting point than the second low temperature glass, such as Au-Sn sealing material, epoxy sealing material, solder sealing material, etc. Except for the above, this embodiment is substantially similar to the previous embodiment of FIGS. 1 and 2.

Figure 4:
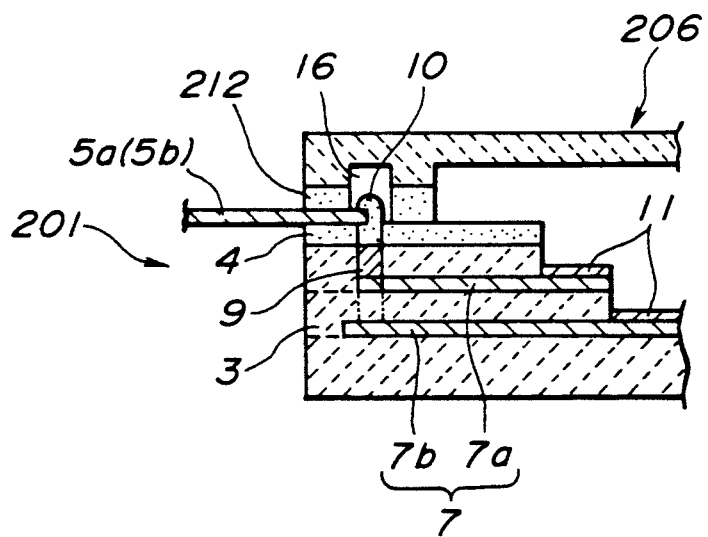
FIG. 4 is an enlarged sectional view of a novel important portion of the package of FIG. 3.

FIG. 4 shows an IC package 201 according to a further embodiment of the present invention. In this embodiment, a recess 16 is provided to the closure plate 206 and the low temperature glass 212 for forming a space around the joint between the silver glass 10 and the earth lead 5b. Similarly, a recess 16 is provided at the joint between the silver glass 10 and the power source lead 5a.

By this embodiment, at the time of joining of the closure plate 206 to the base 3, the weight of the closure plate 206 is applied to the peripheral portion of the silver glass 10 uniformly, thus making it possible to prevent breakage of the brittle silver glass 10 due to the load applied thereto at the time of joining of the closure place 206 to the base. Except for the above, this embodiment is substantially similar to the previous embodiment of FIGS. 1 and 2.

Figure 5:
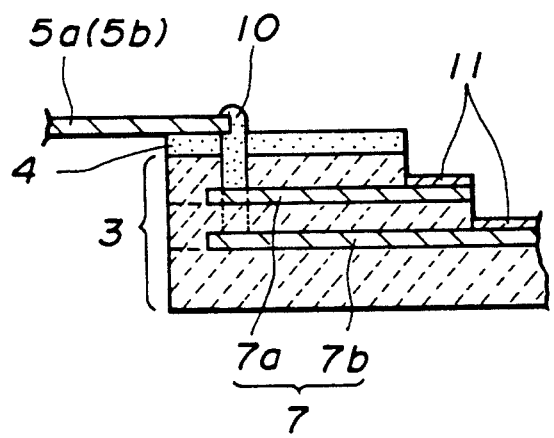
FIG. 5 is a view similar to FIG. 4 but shows a further embodiment.

FIG. 5 shows an IC package 301 according to a further embodiment of the present invention. This embodiment differs from the previous embodiment of FIGS. 1 and 2 in that the ceramic base 3 is not provided with such conductive posts 9 but after the external leads 5 are secured to the ceramic base 3 the silver glass 10 is applied into the through holes to connect the conductive layers 7 to the power source lead 5a and the earth lead 5b, respectively. By this embodiment, the process for forming the conductive posts 9 can be dispensed with, thus making it possible to reduce the manufacturing cost.

Figure 6:
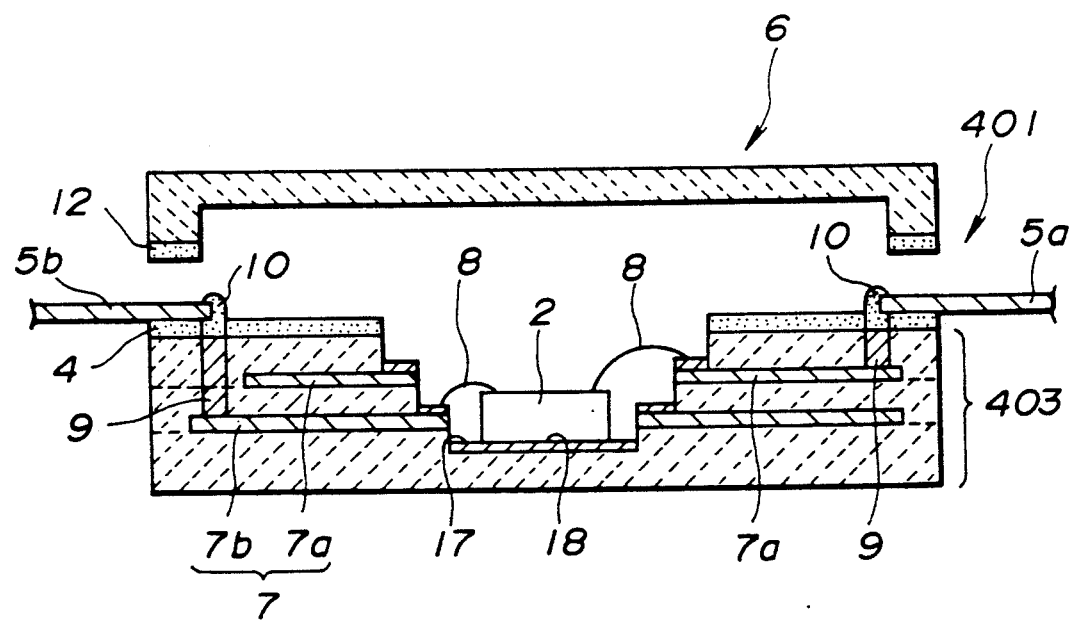
FIG. 6 is a view similar to FIG. 1 but shows a further embodiment.

FIG. 6 shows an IC package 401 according to a further embodiment of the present invention. In this embodiment, the bottom or lowest ceramic layer of the base 403 is recessed to form a further stepwisely receded or recessed central portion 17 for installing thereon the IC chip 2 so that the IC chip 2 is installed in the further stepwisely recessed central portion 17 by way of a mounting 18 made of a conductive joining material such as silver glass, silver polyimide, or the like. By this, it becomes possible to insulate the IC chip 2 from the conductive layer 7b. Further, it can be dispensed with an Au plating or the like expensive plating which is other-wise needed to be applied to the IC chip-installed portion of the ceramic base, thus making it possible to hold down the cost.

Figure 7:
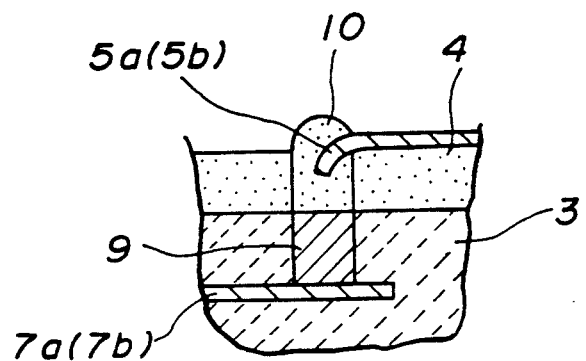
FIGS. 7 and 8 are views similar to FIG. 2 but show further embodiments.

FIG. 7 shows a structure for joining between the power source lead 5a and the power source layer 7a and for joining between the earth lead 5b and the earth layer 7b according to a further embodiment of the present invention. In this embodiment, the portion of the power source lead 5a or earth lead 5b for joining with the silver glass 10 is bent or curved so as to improve the joining between the silver glass 10 and the power source lead 5a or earth lead 5b.

Figure 8:
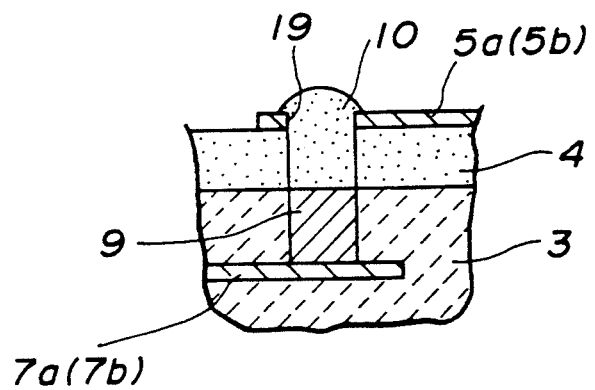

FIG. 8 shows a structure for joining between the power source lead 5a and the power source layer 7a and for joining between the earth lead 5b and the earth layer 7b according to a further embodiment. In this embodiment, the portion of the power source lead 5a or earth lead 5b for joining with the power source layer 7a or earth layer 7b is formed with an opening 19 into which the silver layer 10 is poured to provide electrical connection between the power source lead 5a or earth lead 5b and the conductive post 9.

Figure 9:
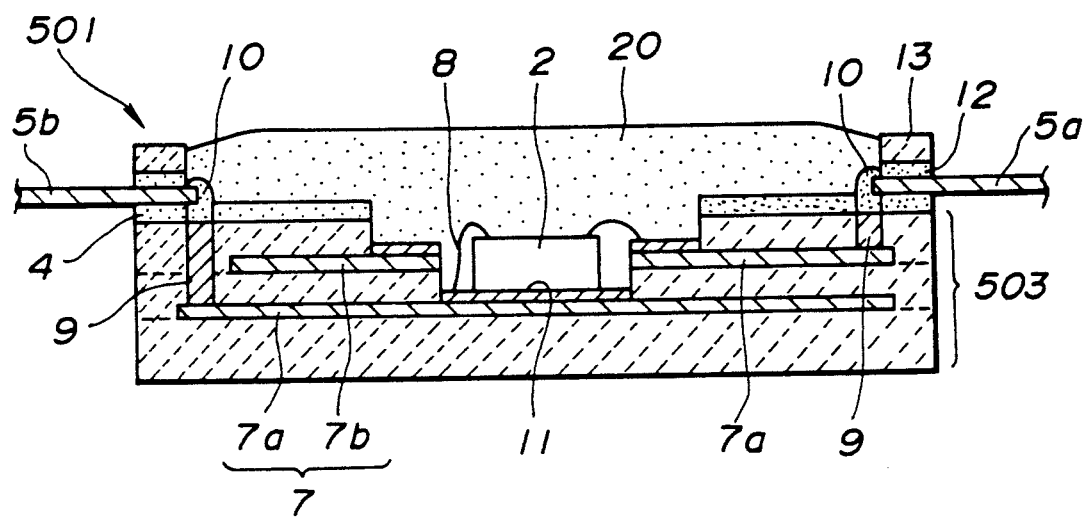
FIGS. 9 and 10 are views similar to FIG. 1 but show further embodiments.

FIG. 9 shows an IC package 501 according to a further embodiment of the present invention. In this embodiment, such a cover 14 in the previous embodiment of FIG. 3 is not utilized but only the frame 13 is secured to the base 3. A mass of synthetic resinous material 20 such as epoxy resin is applied on the base 3 in such a way as to embed or bury therein the IC chin 2 for thereby hermetically sealing the IC chip 2. By this, it becomes possible to make lower the cost of the package.

Figure 10:
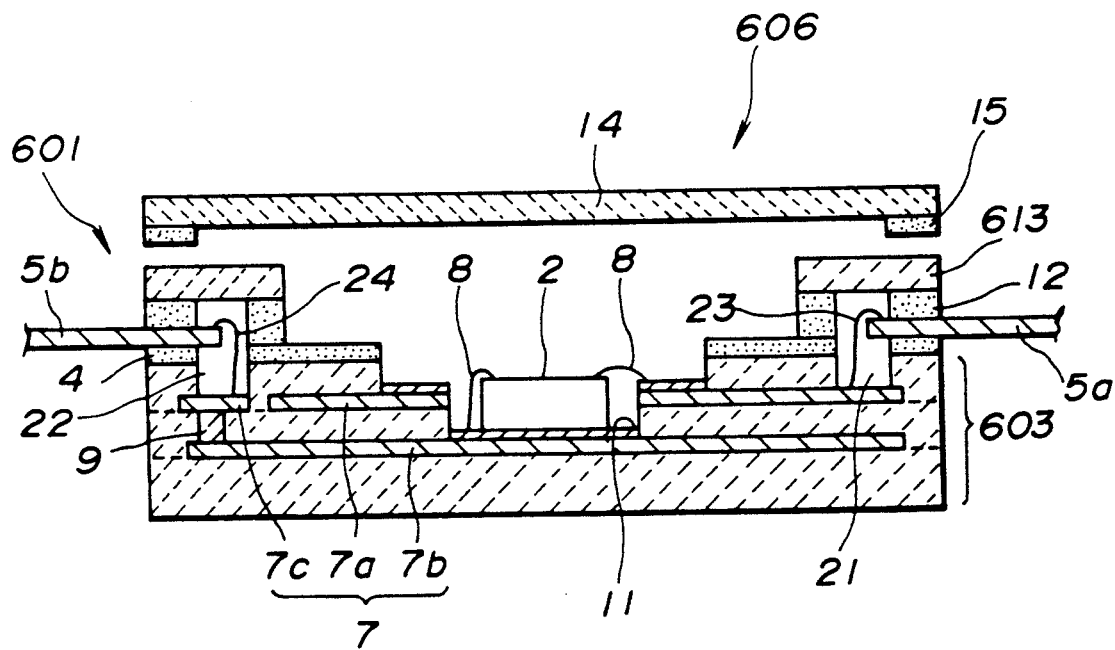

FIG. 10 shows an IC package 601 according to a further embodiment of the present invention. The IC package 601 consists of a ceramic base 603 for installation of an IC chip 2, external leads 5 secured to the ceramic base 603 by means of the first low temperature glass 4 serving as sealing glass, and a frame 613 placed on the external leads 5 and secured thereto by means of the second low temperature glass 12. After installation of the IC chip 2, the frame 613 and cover 14 are secured to the base 3 for hermetically sealing the IC chip 2 similarly to the previous embodiment of FIG. 3 by means of the bonding material 15 such as a third low temperature glass which is of a lower melting point than the second low temperature glass 12, Au-Sn sealing material, solder sealing material, or the like. In the above, the frame 613 and cover 14 are not necessarily separate parts but can be joined into a single piece such as that in the embodiment of FIGS. 1 and 2.

The ceramic base 603 and first and second low temperature glass 4, 12 are cooperative to form cavities 21, 22 at locations adjacent to the outer periphery of the base 603. The bottoms of the cavities 21, 22 are at the same level with the power source layer 7a and respectively defined by conductive layers. The conductive layer formed on the bottom of one cavity 21 constitutes part of the power source layer 7a and has an upper surface which is covered by Ni plating or Au plating. The conductive layer 7c formed on the bottom of the other cavity 22 has an outer surface similarly covered by Ni plating or Au plating and is connected to the earth layer 7b by way of the conductive post 9. The conductive post 9 is formed by conductive ink poured into the hole of the ceramic base 603.

The conductive layer 7a at the bottom of the cavity 21 is connected to the power source lead 5a by way of a bonding wire 23 made of Au, Ni or the like and installed in the cavity 21, whilst the conductive layer 7c at the bottom of the cavity 22 is connected to the earth lead 5b by way of a bonding wire 24 made of Au, Ni or the like installed in the cavity 22.

The IC package 606 according to the embodiment of FIGS. 10 is produced as follows. The ceramic base 603 is produced by substantially the same processes with those of the previous embodiment of FIGS. 1 and 2 except that one green sheet is pierced to have opening for forming part of the cavities 21, 22 before sintering.

Then, the first low temperature glass 4 is printed on the surface of the ceramic base 603. The external leads 5 are disposed on the surface of the first low temperature glass 4 and secured to the ceramic base 603 by once heating the first low temperature glass 4 above the melting point.

Then, one end of the bonding wire 23 is welded to the power source layer 7a while the other end is welded to the power source lead 5a for thereby electrically connecting the power source layer 7a to the power source lead 5a. In a similar manner, the earth lead 7b and the earth lead 5b are connected to each other by means of the bonding wire 24.

The frame 613 and cover 14 are ceramic plates having substantially the same thermal expansion efficiency with that of the ceramic base 3. By using the second low temperature glass 12 which has a lower melting point than the first low temperature glass 4, the frame 13 is secured to the base 603 in a manner to close the cavities 21, 22. Then, by using the third low temperature glass 15 which has a lower melting point than the second low temperature glass 12, the cover 14 is secured to the base 3 for thereby hermetically sealing the IC chip 2. By the above processes, the IC package 1 is completed.

In the above, the second low temperature glass 12 is printed to have openings for forming part of the cavities 21, 22 so as not to damage the boding wires 23, 24 at the time of fixation of the cover 14. Further, the first low temperature glass 4 and second low temperature glass 12 can be of the same quality.

In this embodiment, bonding wires 23, 24 which are cheaper than silver glass are used for connection between the power source lead 5a and the power source layer 7a or for connection between the earth lead 5b and the earth layer 7b, thus making it possible to reduce the manufacturing cost of the package 1. Further, the bonding wire is more reliable in operation than silver glass. Except for the above, this embodiment can produce substantially the same effect of the previous embodiment of FIGS. 1 and 2.

While in the above embodiment the ceramic base is described and shown as being provided with both the power source lead and earth lead, this is not for the purpose of limitation but it may be equipped with only one of them. Further, by employment of an increased number of conductive layers of the base, the signal wiring may be disposed inside of the base.

While the connection between the conductive layer and the power source lead or earth lead is described and shown as being of the type obtained by using silver glass or bonding wire, this is not for the purpose of limitation but it may be attained by using another conductive material.

What is claimed is:

1. An IC package assembly comprising:
   a ceramic base having a laminated structure including first and second conductive layers;
   an IC chip installed on said base and having a plurality of power source terminals electrically connected to said first conductive layer by wire bonding and a plurality of earth terminals connected to said second conductive layer by wire bonding;
   a first external lead electrically connected to said first conductive layer to serve as a power source lead;
   a second external lead electrically connected to said second conductive layer to serve as an earth lead;
   first sealing glass means for securing said first and second external leads to said base;
   a closure member; and
   second sealing glass means for securing said closure member to said base and hermetically sealing said IC chip;
   said first sealing glass means further comprising a sheet of first low temperature glass having a pair of openings filled with silver glass for electrically connecting said first and second external leads to said first and second conductive layers, respectively.

2. An IC package assembly according to claim 1, wherein said ceramic base has a pair of openings at locations coinciding with said openings of said first low temperature glass, said openings of said base having bottoms defined by said first and second conductive layers, respectively, said openings of said base being filled with conductive ink to form conductive posts electrically connected to said silver glass filling said opening of said first low temperature glass for thereby electrically connecting said first and second external leads to said first and second conductive layers, respectively.

3. An IC package assembly according to claim 2, wherein said conductive posts are covered by Ni plating at portions where they are electrically connected to said silver glass.

4. An IC package assembly according to claim 2, wherein said conductive posts are covered by Au plating at portion where they are electrically connected to said silver glass.

5. An IC package assembly according to claim 2, wherein said ceramic base is formed from three ceramic green sheets consisting of a first green sheet having a central portion for installing thereon said IC chip and an upper surface covered by said second conductive layer, a second green sheet placed upon said first green sheet and having at a central portion thereof and opening for loosely surrounding said IC chip, said second green sheet having an upper surface covered by said first conductive layer, and a third green sheet placed upon said second green sheet and having at a central portion thereof an opening larger than said opening of said second green sheet so that said base has a stepwisely recessed central portion in which said IC chip is installed.

6. An IC package assembly according to claim 5, wherein said first green sheet is recessed at a central portion thereof to form a further stepwisely recessed central portion of said base, said IC chip being installed on a bottom of said further stepwisely recessed central portion of said base by way of a mounting made of a conductive joining material.

7. An IC package assembly according to claim 6, wherein said conductive joining material is silver glass.

8. An IC package assembly according to claim 6, wherein said conductive joining material is silver polyimide.

9. An IC package assembly according to claim 5, wherein said first mentioned sealing glass means comprises first low temperature glass and said second sealing glass means comprises second low temperature glass having a lower melting point than said first low temperature glass.

10. An IC package assembly according to claim 9, wherein said closure member comprises a frame secured to said base by means of said second low temperature glass and a cover secured to said frame by means of third sealing glass means.

11. An IC package assembly according to claim 10, wherein said third sealing glass means comprises third low temperature glass having a lower melting point than said second low temperature glass.

12. An IC package assembly according to claim 9, wherein said closure member and said second low temperature glass are formed with a recess for providing a space around a joining portion between said silver glass and said first external lead.

13. An IC package assembly according to claim 9, wherein said closure member and said second low temperature glass are formed with a recess for providing a space around a joining portion between said silver glass and said second external lead.

14. An IC package assembly according to claim 1, wherein said ceramic base has a pair of openings having bottoms defined by said first and second conductive layers, respectively, said openings of said first low temperature glass being arranged so as to coincide with said openings of said ceramic base, said openings of said base being filled with silver glass by way of which said first and second external leads are electrically connected to said first and second conductive layers, respectively.

15. An IC package assembly according to claim 1, wherein said external leads have end portions bent into said silver glass.

16. An IC package assembly according to claim 1, wherein said external leads have end potions formed with openings, said silver glass further filling said openings of said external leads.

17. An IC package assembly comprising:
a ceramic base having a laminated structure including first and second conductive layers;
an IC chip installed on said base and having a plurality of power source terminals electrically connected to said first conductive layer and a plurality of earth terminals connected to said second conductive layer;
a first external lead electrically connected to said first conductive layer to serve as a power source lead;
a second external lead electrically connected to said second conductive layer to serve as an earth lead;
first sealing glass means for securing said first and second external leads to said base; and
a closure member secured to said base for hermetically sealing said IC chip, said closure member consisting of a frame secured to said base by means of second sealing glass and a cover secured to said frame by means of third sealing glass means, said base and said second sealing glass means cooperating to define cavities extending between said first and second external leads and said first and second conductive layers, respectively, and receiving bonding ires electrically connecting therebetween, said cavities having top ends defined by said frame.

18. An IC package assembly according to claim 17, wherein one of said cavities has a bottom which is defined by a third conductive layer at the same level with said first conductive layer whilst the other of said cavities has a bottom which is defined by said first conductive layer, said second external lead being electrically connected to said second conductive layer by way of one of said bonding wire, said third conductive layer and a conductive post provided between said second and third conductive layers.

19. An IC package assembly according to claim 1, further comprising a mass of synthetic resinous material applied to said base in such a manner that said IC chip is buried and hermetically sealed in said mass of synthetic resinous material.

20. An IC package assembly according to claim 1, wherein said first and second external leads are electrically connected to the first and second conductive layer, respectively, by means selected from the group consisting of silver polyimide, silver glass and bonding wire.

* * * * *